United States Patent [19]

Doemens

[11] Patent Number: 4,891,578
[45] Date of Patent: Jan. 2, 1990

[54] DEVICE FOR THE ELECTRICAL FUNCTION TESTING OF WIRING MATRICES, PARTICULARLY OF PRINTED CIRCUIT BOARDS

[75] Inventor: Guenter Doemens, Holzkirchen, Fed. Rep. of Germany

[73] Assignee: Siemens Aktiengesellschaft, Berlin and Munich, Fed. Rep. of Germany

[21] Appl. No.: 168,965

[22] Filed: Mar. 16, 1988

[30] Foreign Application Priority Data

Mar. 31, 1987 [DE] Fed. Rep. of Germany ....... 3710595

[51] Int. Cl.⁴ ............................................. G01R 31/02
[52] U.S. Cl. ................................ 324/73 R; 324/158 F
[58] Field of Search .................... 365/201; 324/158 F, 324/158 D, 73 R, 73 PC, 537, 538

[56] References Cited

U.S. PATENT DOCUMENTS

| | | | |
|---|---|---|---|
| 3,764,898 | 10/1973 | Bohlen et al. | 324/538 |
| 3,956,698 | 5/1976 | Malmberg et al. | 324/158 B |
| 4,047,077 | 9/1977 | Veith | 324/769 |
| 4,464,627 | 8/1984 | Munakata et al. | 324/158 B |
| 4,777,432 | 10/1988 | Doemens et al. | 324/73 PC |

FOREIGN PATENT DOCUMENTS 0102565 3/1984 European Pat. Off. .

OTHER PUBLICATIONS

Publication of Elektronik Produktion und Proueftechnik, Nov. 1979, pp. 472–473.

Primary Examiner—Ernest F. Karlsen
Assistant Examiner—Edward F. Urban
Attorney, Agent, or Firm—Hill, Van Santen, Steadman & Simpson

[57] ABSTRACT

A device for the electrical function testing of wiring matrices, particularly of printed circuit boards. In the electrical function testing of wiring matrices, particularly of printed circuit boards, the contacting of selected measuring locations results via gas discharging channels. The plurality of leads required for the selection of the individual measuring locations is drastically reduced. In the new device, every gas discharge channel is selectable by an associated busbar and by the controllable charging with light of a photoconductor arranged between the gas discharge channel and the associated busbar.

23 Claims, 4 Drawing Sheets

4,891,578

DEVICE FOR THE ELECTRICAL FUNCTION TESTING OF WIRING MATRICES, PARTICULARLY OF PRINTED CIRCUIT BOARDS

BACKGROUND OF THE INVENTION

The present invention is directed to a device for electrical function testing of wiring matrices, particularly of printed circuit boards.

In automatic testing units and adaptors for printed circuit boards equipped with or without components as well as for wiring matrices in solder or crimp technology, the contacting of selected measuring locations is usually undertaken via resilient test probes. The resilient test probes are arranged according to the grid dimension of the wiring matrix to be tested and are secured with spring sleeves that are pressed into a carrier plate and into which the test probes are inserted. The smallest distance between the measuring locations as well as the current load via the diameter of the resilient test probes are usually decisive in the selection of the test probes. However, 0.69 .mm is cited as a lower limit dimension for the diameter of the probe (Elektronik Produktion und Prueftechnik, November 1979, pages 472 and 473).

Conductivity and insulation measurements between test locations formed by the grid points according to the printed circuit board layout are performed with known devices for electrical function testing of printed circuit boards. Since the resilient test probes provided for contacting the test locations must be arranged in a grid pattern corresponding to the printed circuit board, the construction of such devices is increasingly more difficult because of the decreasing grid dimension and the increasing areas of the printed circuit boards. Thus, an arrangement of the resilient test probes in grid dimensions below 1.0 mm cannot reliably provide precision, mechanical contacting of the test locations. The plurality of required leads and switch elements also increases with the number of measuring locations that, for example, can amount to as many as a hundred thousand. Such an apparatus is very complex resulting in high costs. Further, the probability of a complete contacting of the printed circuit board decreases considerably with the plurality of measuring locations.

EP-A-0 102 565 discloses a device for the electrical function testing of wiring matrices wherein the ohmic contacting of the measuring locations is replaced by non-touching, ionic contacting via gas discharge paths. To this end, a plurality of gas discharge channels provided with electrodes are located in a carrier plate that can be placed onto the wiring matrices. Gas discharge channels in a frame of the wiring matrices are open in the direction toward the measuring locations. When two selected measuring locations are connected to one another in an electrically conductive fashion by an interconnect, then the associated gas discharge channels form two series-connected gas discharge paths that can be ignited by applying an adequately high voltage to the electrodes. A current flow that can be evaluated for testing purposes results with the ignition of the gas discharges. When the ignition of the gas discharges fails to occur or when too low a current flows after an ignition, it can be concluded that an interrupted connection exists or that an electrically conductive connection was not formed when the wiring matrix was constructed. When an alternating voltage is superimposed on the voltage applied to the electrodes, then the resulting current change can be measured in a phase-sensitive manner relative to the applied alternating voltage and can be utilized for identifying the resistance of a connection existing between the selected measuring locations. The known device thus provides conductivity and insulation measurements, whereby an extremely high reliability is achieved by avoiding ohmic contacts. In particular, wiring matrices having small grid dimensions of the measuring locations down to 0.1 mm can be reliably tested with the principle of ionic contacting of the measuring locations via gas discharge channels which can be constructed in extremely small dimensions. However, for a high plurality of measuring locations in a wiring matrix, problems continue to occur that can be attributed to the numerous leads and switch elements for the connection of the electrodes of the gas discharge channels.

SUMMARY OF THE INVENTION

An object of the present invention is to drastically reduce the number of leads in a device of the type initially cited.

The present invention is based on the principle that the connection of the electrodes of a plurality of gas discharge lines can be formed via common busbars. This is based on the charging with light of a photoconductor located between the gas discharge channel and an associated busbar. This is required as an additional condition for the initiation of a gas discharge in the gas discharge channels associated with the selected measuring locations. The plurality of leads can be considerably reduced with the inventive addressing of the selected measuring locations or of the gas discharge channels associated with the selected measuring locations, resulting in a greater plurality of gas discharge channels being associated with the busbars. In addition to a considerable reduction in wiring requirements, an apparatus can be constructed for the electrical function testing of printed circuit boards having large printed circuit board formats and small grid dimensions. Also, a corresponding reduction in manufacturing costs results. The additional requirements for the addressable charging with light of the photoconductor arranged between the gas discharge channels and the associated busbars is slight in comparison to the advantages. As a result of charging with light of the photoconductors associated with the selected measuring locations, the resistance of the photoconductors decreases and an adequate current for igniting and maintaining a gas discharge can flow.

In the inventive device for electrical function testing of wiring matrices, the measuring locations are preferably contacted, ionically, i.e. the measuring locations on the printed circuit board directly form the electrodes of the allocated gas discharge channels. An extremely high reliability of testing is achieved by avoiding ohmic contacts. The advantages of the inventive addressing of measuring locations or of gas discharge channels result when an ohmic contacting of the measuring locations is undertaken by resilient test probes located at the lower end of the gas discharge channels. These resilient test probes then form one of the two electrodes of the gas discharge paths, i.e. they are ionically contacted at that end lying opposite a tip thereof and can be formed with smaller dimensions than traditional test probes. The small grid dimensions obtainable with ionic contacting with gas discharge channels open in the direction toward the measuring locations cannot be achieved with test probes.

According to a preferred development of the present invention, the photoconductors associated with the gas discharge channels are connected to one another in rows via the busbars. Such a combination of the terminals of the photoconductors in rows is particularly adapted to a regular grid arrangement of the measuring locations as is usually present in printed circuit boards. A simple configuration of the busbars results.

It is also especially advantageous for the busbars to proceed transversely relative to the principal directions of the wiring matrices to be tested. This arrangement provides that two selected measuring locations cannot be associated with the same busbar. When, for example, the busbars are orientated at an angle of 45° relative to the principal directions of the wiring, then all measuring locations can be reliably covered by turning the overall carrier plate by a angle of 90° or 270° relative to the wiring.

It is provided according to an especially preferred development of the present invention that every busbar is connected to two lines via a respective photoresistor and that every photoresistor is charged with light in a controllable fashion. A type of "optical multiplexer" for the addressing of the busbars is formed by the photoresistors. In addition to the controllable charging of photoconductors and photoresistors with light, only two other lines are required for selecting the measuring locations.

It has also proven expedient for the busbars to be arcuately formed around the gas discharge channels. When the photoconductors are also additionally arcuately formed around the gas discharge channels, optimum conditions result for the placement of busbars and photoconductors on the carrier plate. Given such an arrangement, light rays can penetrate into the selected gas discharge channels and promote the ignition of gas discharges there.

According to a further, preferred development of the present invention, the photoconductors are composed of cadmium selenide or cadmium sulfide. These two photoconductive materials provide a considerable boost in conductivity from light irradiation.

In principle, the photoconductors themselves can be utilized as electrodes for the gas discharge channels. A higher functional reliability of the overall device, however, is achieved when the photoconductors are connected to associated electrodes of the gas discharge channels.

The busbars are preferably manufactured using thin-film technology, i.e. techniques that have already proven themselves in the manufacture of layered circuits. Thin film technology can be used to manufacture the photoconductors, the photoresistors and the two lines. Accordingly, it is especially beneficial when the busbars, the photoconductors, the photoresistors and the two lines are applied on the carrier plate using thin-film technology.

The controllable charging with light of the photoconductors and/or of the photoresistors can be achieved by masks located over them. Potentially controllable openings of these masks allow light from a light source to pass through only at the desired locations. The imaging of the respective holes of a mask onto the selected photoconductors and/or photoresistors is also possible. According to an especially preferred development of the present invention, the photoconductors and/or photoresistors can be charged with light via a deflectable beam. In view of the desired boost in conductivity, it is especially beneficial when the beam is formed by a focused laser beam.

According to a further, preferred development of the present invention, an acousto-optical deflector is provided for deflecting the beam, which has the benefit of a short positioning time.

For appropriately short positioning times of the deflectable beam, the photoresistors can be serially charged with light. This is achieved by a positioning time that is short in comparison to the recombination time or decay time of the photoresistors. When using a "optical multiplexer", it is expedient to serially charge the photoconductors and the photoresistors with light. The controllable light charging can then be provided by a single laser, whereby a further, considerable reduction in the complexity of the apparatus results for the selection of the measuring location.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which:

DESCRIPTION OF THE PREFERRED EMBODIMENT

Figure 1:
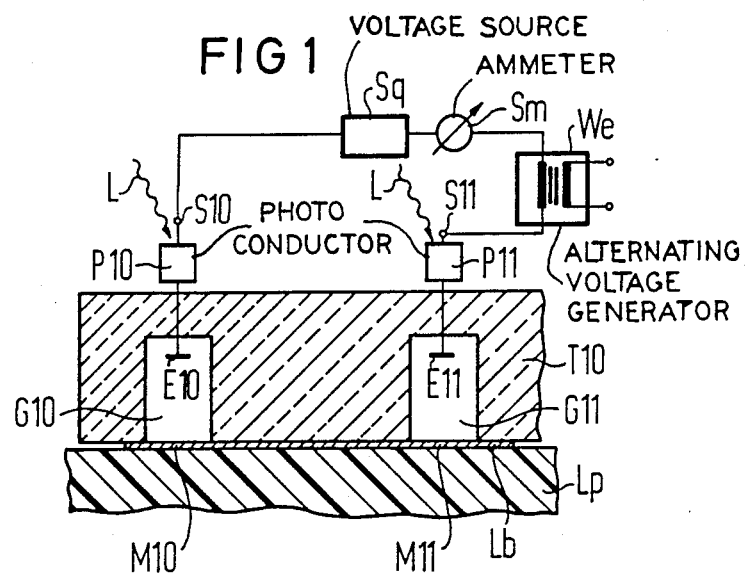
FIG. 1 is a cross-sectional schematic drawing of a device constructed according to the present invention for the electrical function testing of printed circuit boards.

In a highly simplified, schematic view, FIG. 1 shows the basic functioning of a device for the electrical function testing of a printed circuit board Lp using non-touching ionic contacting of the measuring locations via gas discharge paths. The ends of an interconnect Lb on the upper side of the printed circuit board Lp forms measuring locations M10 and M11. A carrier plate T10 of an insulating material such as, for example, glass is put in place on the upper side of the printed circuit board Lp. A plurality of gas discharge channels are located in this carrier plate in the form of blind holes. Only the gas discharge channel G10 associated with the measuring location M10 and the gas discharge channel G11 associated with the measuring location M11 are shown in FIG. 1. An electrode E10 is located at an end of the gas discharge channel G10 opposite the measuring location M10, this electrode E10 being connected to a busbar S10 via a photoconductor P10 which acts as a resistor. Similarly, an electrode E11 in the gas discharge channel G11 is connected to a busbar S11 via a photoconductor P11 acting as a resistor. The photoconductors allocated to a multitude of gas discharge channels (not shown in FIG. 1) are connected to one another in rows via the busbars S10 and S11 which are orientated perpendicular to the plane of the drawing.

When the two measuring locations M10 and M11 are selected during the electrical function testing of the printed circuit board Lp, the electrodes E10 and E11 of the gas discharge channels G10 and G11 are selected via the busbars S10 and S11 and via the allocated photoconductors P10 and P11. In the case of such a selection, a voltage source Sq, an ammeter means Sm and an altering voltage generator We are arranged in series between the photoconductors P10 and P11.

The overall arrangement shown in FIG. 1 is placed in an enclosure under a reduced pressure of, for example, 10 Tor, whereby the enclosure is filled with a gas such as, for example, nitrogen. Gas discharge paths that are connected in series via the interconnect Lb are thus formed between the electrode E10 and the measuring location M10 as well as between the electrode E11 and the measuring location M11. The voltage source Sq provides a voltage level such that twice the ignition voltage is applied to these series-connected gas discharge paths when the photoconductors P10 and P11 are in a low resistance state due to exposure to light L. The light L, for example, is the focused beam of a He laser or of a Ne laser. An acousto-optical deflector can be used to deflect the laser beam and the charging of the photoconductors P10 and P11 can be performed serially, since the positioning time of the acousto-optical deflector is short in comparison to the recombination time or decay time of the photoconductors P10 and P11. Fundamentally, an ignition of gas discharges is only possible when the selected gas discharge channels are driven via their associated busbars and when the associated photoconductors are charged with light simultaneously or shortly thereafter. As a result, a reliable addressing of the selected gas discharge channels or measuring locations is provided.

When gas discharges ignite in the gas discharge channels G10 and G11, a charging by the light L of the photoconductors P10 and P11 must end. Data can be derived from the burning of the two gas discharges and is registered via the ammeter means Sm connected in the circuit and indicates that the two measuring locations M10 and M11 are adequately electrically connected to one another or that the interconnect Lb is not interrupted For measurements of the resistance between the measuring locations M10 and M11, an alternating voltage is additionally superimposed via the alternating voltage generator We. This superimposition can be provided by inductive coupling, as shown in FIG. 1. The resistance measurements are made in the differential reversing point of the gas discharge characteristic, whereby the internal resistances of the gas discharge paths are bridged by an alternating current flow. Small fluctuations U in the superimposed alternating voltage thereby lead to relatively great fluctuations I in the current. The phase-sensitive ammeter mean Sm that, for example, can be a commercially available lock-in amplifier connected in the circuit, registers the current fluctuations and the resistance R can be calculated from the relationship $R = U/I$. Faults wherein the interconnect Lb is only partially interrupted can be detected from the level of the measured resistance. Moreover, the calculation of the resistance R can also be utilized as an insulation measurement.

Figure 2:
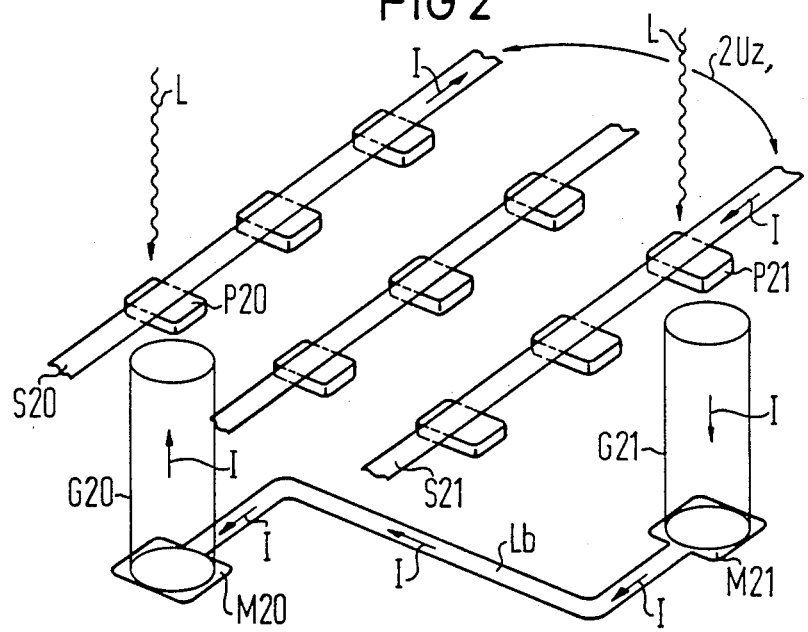
FIG. 2 is a perspective drawing showing the arrangement of busbars, photoconductors, gas discharge channels, measuring locations and interconnects in a highly simplified, schematic view.

FIG. 2 shows a greatly simplified, schematic view of a system of parallel, partially transparent busbars that are each in communication with the associated gas discharge channels via a photoconductor connected therebetween using thin-film technology. As shown in FIG. 2 the measuring locations M20 and M21 connected to one another by an interconnect Lb are to be selected. To achieve this, twice the ignition voltage $2U_z$ is first applied to the allocated busbars S20 and S21. The selection along these busbars S20 and S21 then results by charging with light L the photoconductors P20 and P21 associated with the measuring locations M20 and M21. This light charging, for example, can again be serially undertaken with a single, deflectable laser beam. The photoconductors P20 and P21 thus become low-resistant and an adequate current I flows for igniting and maintaining gas discharges in the corresponding gas discharge channels G20 and G21.

Figure 3:
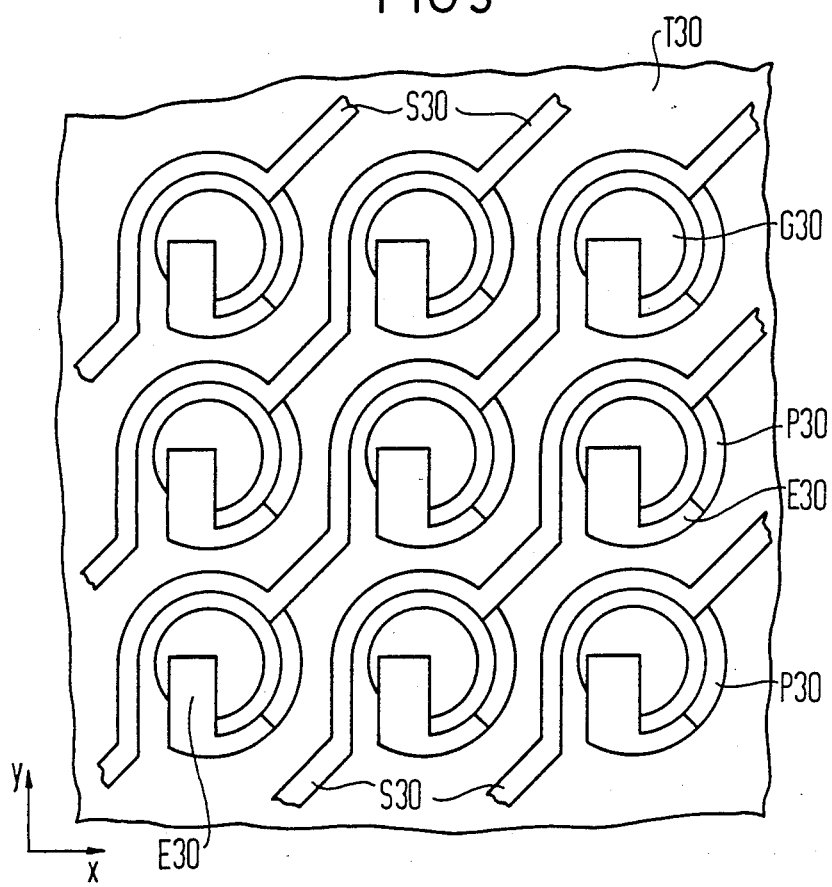
FIG. 3 is a plan view of a carrier plate on which busbars, photoconductors and electrodes have been applied in thin-film technology.

FIG. 3 shows a plan view of a carrier plate T30 in which gas discharge channels G30 are located in the grid dimension of the wiring matrix to be tested. A system of parallel busbars S30, photoconductors P30 and electrodes E30 are applied to the surface of the carrier plate T30 using thin-film technology. The bus bars S30 are arcuately formed around the gas discharge channels G30 in one direction, whereas the photoconductors P30 are arcuately conducted around the gas discharge channels G30 in the other direction. The electrodes E30 connecting the photoconductors P30 initially follow a short arcuate course and then have their ends projecting into the corresponding gas discharge channels G30.

The busbars S30 proceed at an angle of 45° transversely relative to the principle directions X and Y of the wiring matrix to be tested. This has the advantage that those measuring locations that are initially associated with the same busbar can also be selected. In this case, the entire carrier plate T30 is turned by an angle of 90° or 270° relative to the wiring to be tested. After such a turning, the two measuring locations are then associated with two different busbars.

Figure 4:
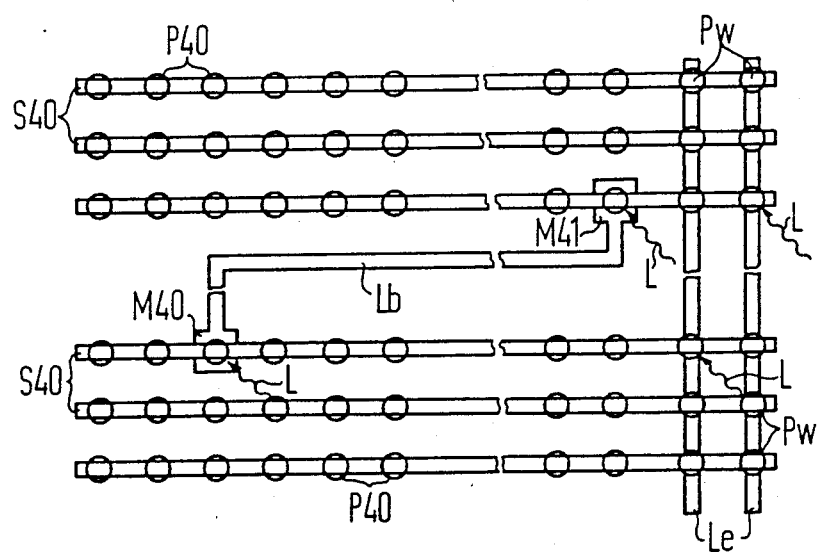
FIG. 4 is a schematic drawing depicting a device constructed according to the present invention for the electrical function testing of printed circuit boards having an additional, optical multiplexer for driving the busbars.

FIG. 4 shows an arrangement that largely corresponds to FIG. 2 wherein, however, the selection of the individual measuring locations is even further simplified by an additional optical multiplexer. Photoconductors P40, a system of partially transparent busbars S40, photoresistors Pw and two partially transparent lines Le crossing all busbars S40 are applied to the carrier plate (not shown here) using thin-film technology. The photoconductors P40 are fashioned as thin, circular disks that are situated under the busbars S40 and are connected to the electrode of a gas discharge channel (not visible in FIG. 4). The photoresistors Pw that correspond to the photoconductors P40 are likewise fashioned as thin, circular disks and are located at the intersections of the busbars S40 and the lines Le between a busbar S40 and a line Le.

FIG. 4 further shows an interconnect Lb that connects the measuring locations M40 and M41 to one another. For selecting these two measuring locations M40 and M41, the two allocated photoconductors P40 and the two allocated photoresistors Pw of the optical multiplexer are charged with light L. The light is directed with the assistance of an acousto-optically deflectable laser beam. The two photoconductors P40 charged with light L and the two photoresistors Pw charged with light L then go into a low resistance state so that twice the ignition voltage is connected to the gas discharge paths via the two lines Le. An ignition of the gas discharge paths then indicates that the interconnect Lb is not interrupted.

Figure 5:
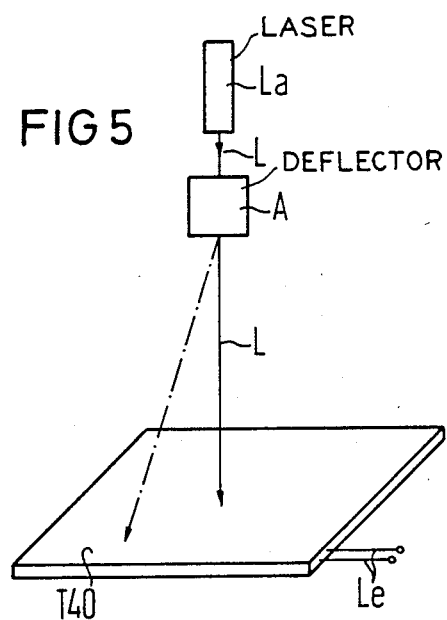
FIG. 5 is an overall, perspective view of the device depicted in FIG. 4.

FIG. 5 shows a perspective, overall view of the device schematically disclosed in FIG. 4. This shows a carrier plate T40 for, for example having $1000 \times 1000$ grid points, whereby a photoconductor P40 of FIG. 4 is allocated to every grid point. The two lines Le then have 2,000 photoresistors Pw of FIG. 4 allocated to them. A laser La such as, for example, a He laser or a Ne-laser is situated above the carrier plate T40. The emission thereof being capable of being directed as light L onto each of the $10^6$ photoconductors and each of the 2,000 photoresistors. The deflection is provided by an acousto-optical deflector A. Only one deflectable beam and the two lines Le are required for selecting the individual measuring locations with $10^{12}$ connection possibilities.

Figure 6:
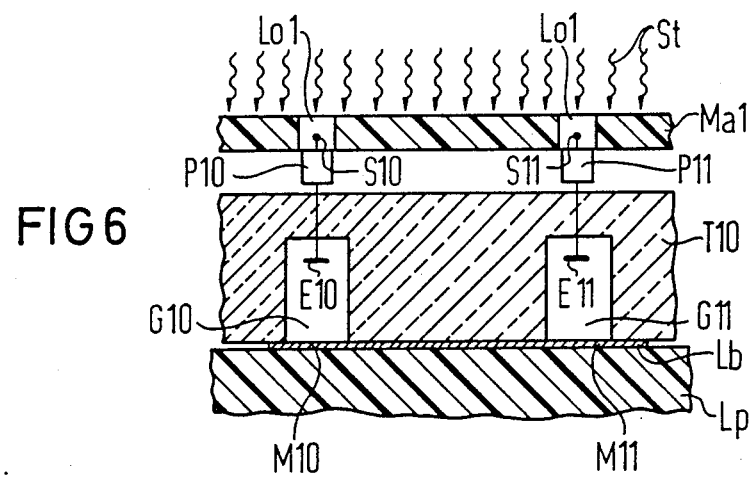
FIG. 6 is a cross-sectional view showing a first modification of the FIG. 1 device.

FIG. 6 shows a first modification of the fundamental principle disclosed in FIG. 1. The light charging of the selected photoconductors here ensues via a planarly distributed radiation St and via a mask Ma1 put in place on the carrier plate T10. The mask Ma1 allows the radiation to pass through only in the region of the holes Lo1 that are associated with selected gas discharge channels G10 and G11 and the measuring locations M10 and M11. It is clear that the charging of selected photoconductors and, of selected photoresistors Pw of FIG. 4, can be controlled by the respective position of holes Lo1 in the mask Ma1 or in a plurality of masks.

Figure 7:
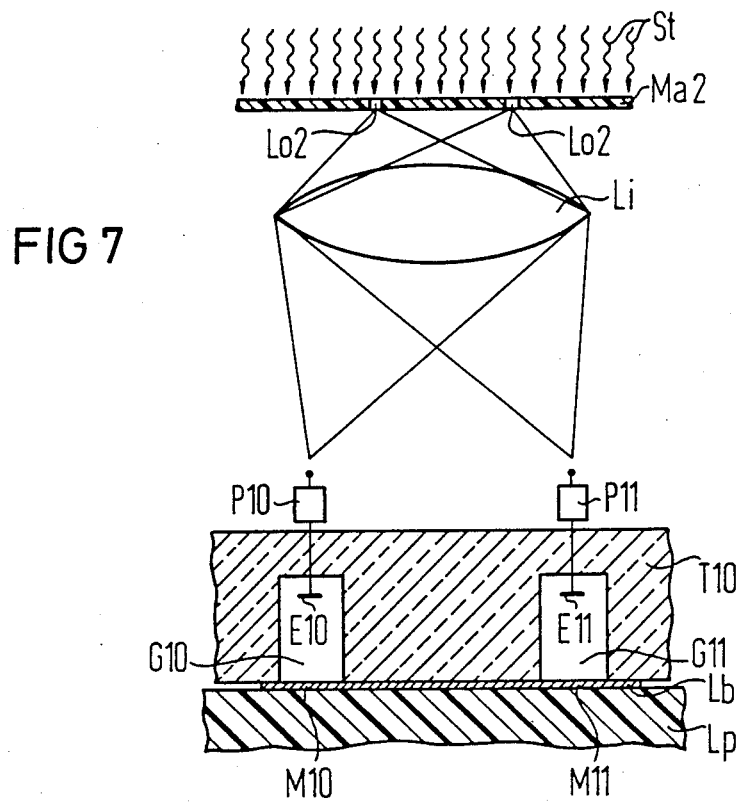
FIG. 7 is a cross-sectional view showing a second modification of the FIG. 1 device.

FIG. 7 shows a second modification of the basic principle disclosed in FIG. 1. Here, the radiation St illuminates a mask Ma2 whose holes Lo2 are imaged onto the photoconductors P10 and P11 via a lens system Li and thereby charges the photoconductors with light.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A device for use in a system for the electrical function testing of wiring matrices, the device having a carrier plate located adjacent the wiring matrix and provided with a plurality of gas discharge channels, whereby at least two selected measuring locations of the wiring matrix are ionically contacted via the associated gas discharge channels, comprising every gas discharge channel selectable by an associated busbar of at least two busbars on the carrier plate and for at least each selected gas discharge channel a photoconductor on the carrier plate connected between the selected gas discharge channel and the associated busbar, the photoconductor being controlled by charging with light, wherein the system has means for providing the light and means for testing the two selected measuring locations via the busbars.

2. The device according to claim 1, wherein the photoconductors associated with the gas discharge channels are connected to one another in rows via the busbars.

3. The device according to claim 1, wherein the busbars are oriented transversely relative to the principle directions (X, Y) of the wiring matrices to be tested.

4. The device according to claim 1, wherein each busbar is connected to two lines via two photoresistors, respectively, and wherein every photoresistor can be charged with light in a controllable fashion.

5. The device according to claim 1, wherein the busbars are arcuately formed around the gas discharge channels.

6. The device according to claim 1, wherein the photoconductors are arcuately formed around the gas discharge channels.

7. The device according to claim 1, wherein the photoconductors are composed of cadmium sulfide.

8. The device according to claim 1, wherein the photoconductors are connected to associated electrodes of the gas discharge channels.

9. The device according to claim 1, wherein the busbars are manufactured using thin-film technology.

10. The device according to claim 1, wherein the photoconductors are manufactured using thin-film technology.

11. The device according to one claim 4, wherein the photoresistors are manufactured using thin-film technology.

12. The device according to claim 4, wherein both lines are manufactured using thin-film technology.

13. The device according to claim 4, wherein the busbars, the photoconductors, the photoresistors and the two lines are applied to the carrier plate using thin-film technology.

14. The device according to claim 1, wherein the photoconductors can be charged with light via a mask.

15. The device according to claim 4, wherein the photoresistors can be charged with light via a mask.

16. The device according to claim 1, wherein the photoconductors can be charged with light via a deflectable beam.

17. The device according to claim 4, wherein the photoresistors can be charged with light via a deflectable beam.

18. The device according to claim 16, wherein the beam is formed by a focusable laser beam.

19. The device according to claim 16, wherein an acousto-optical deflector is provided for deflecting the beam.

20. The device according to claim 16, wherein the photoconductors are serially chargeable with light.

21. The device according to claim 17, wherein the photoresistors are serially chargeable with light.

22. The device according to claim 4, wherein the photoconductors and the photoresistors are serially chargeable with light, the photoconductors and the photoresistors being charged with light via a deflectable beam.

23. The device according to claim 1, wherein the photoconductors are composed of cadmium selenide.

* * * * *